(12) United States Patent
Ogi

(10) Patent No.: US 6,903,472 B2
(45) Date of Patent: Jun. 7, 2005

(54) RECTIFYING APPARATUS HAVING WIND BLOCKING MEMBER

(75) Inventor: Hiroyuki Ogi, Komaki (JP)

(73) Assignee: Denso Corporation, Kariya (JP)

( * ) Notice: Subject to any disclaimer, the term of this patent is extended or adjusted under 35 U.S.C. 154(b) by 71 days.

(21) Appl. No.: 10/352,155

(22) Filed: Jan. 28, 2003

(65) Prior Publication Data

US 2003/0147212 A1 Aug. 7, 2003

(30) Foreign Application Priority Data

Jan. 28, 2002 (JP) ......................................... 2002-018453

(51) Int. Cl.⁷ ........................... H02K 19/36; H02K 9/06
(52) U.S. Cl. ......................... 310/68 D; 310/58; 310/64
(58) Field of Search .................................. 310/68 D, 64, 310/55, 58; 363/141, 145

(56) References Cited

U.S. PATENT DOCUMENTS

| 4,472,649 | A | * | 9/1984 | Namba et al. ............ 310/68 D |
| 5,331,231 | A | * | 7/1994 | Koplin et al. ............. 310/68 D |
| 5,866,963 | A | * | 2/1999 | Weiner et al. ............ 310/68 D |
| 5,982,062 | A | * | 11/1999 | Gautier ..................... 310/68 D |
| 6,307,289 | B1 | * | 10/2001 | Skala ....................... 310/68 D |

FOREIGN PATENT DOCUMENTS

| JP | A 9-107666 | 4/1997 | .......... H02K/19/36 |
| JP | 2003-224953 | * 8/2003 | .......... H02K/19/36 |

* cited by examiner

*Primary Examiner*—Karl Tamai
(74) *Attorney, Agent, or Firm*—Oliff & Berridge, PLC

(57) ABSTRACT

A rectifying apparatus for a.c. dynamo for vehicle is disclosed. The rectifying apparatus of the present invention comprises: rectifier elements for rectifying a.c. current; through holes for fixing the rectifier elements; and a radiator plate for radiating heat generated by the rectifier elements. The rectifier elements are disposed at a part of the through holes, while the blocking members are disposed at the rest of the through holes. The open through holes at which the rectifier elements are not disposed are blocked by the blocking elements, thereby preventing the cooling wind from passing through the through holes, prohibiting the concentrated leakage of the cooling wind and thus obtaining a cooling effect as designed.

9 Claims, 5 Drawing Sheets

RECTIFYING APPARATUS HAVING WIND BLOCKING MEMBER

BACKGROUND OF THE INVENTION

1. Field of the Invention

The present invention relates to a rectifying apparatus for an alternating current dynamo which is mounted on a vehicle such as a passenger car or track.

2. Description of the Related Art

With a recent reduction of a space of an engine room of the passenger car, it has become of interest to manufacture compact-sized a.c. dynamos for vehicle. Further, with a recent tendency of demanding high-grade vehicles, it has become of interest to power up the vehicle use a.c. dynamos, due to an increase in a number of electronic parts. However, when the vehicle use a.c. dymanos are made compact-sized and highly-powered, they are caused to lower their product life, due to a raise of an internal temperature of the vehicle. Therefore, it is an object to be urgently solved to prevent the internal temperature raise.

On the other hand, the electronic parts are being used commonly, i.e., standardized, in order to reduce their production cost. For example, a plurality of through holes are provided in a radiator plate of the rectifying apparatus for the vehicle use a.c. dynamo. As for a number of the through holes for fitting rectifier elements, the number is maximized in accordance with a maximum number of rectifier elements possibly used. However, in a low power consumption rectifying apparatus, only about half number of the rectifier elements are fitted into the radiator plate and another half number of the through holes remain unused and open.

However, cooling wind passes through the unused open through holes, thereby causing a concentrated leakage of the cooling wind, which will be explained, referring to the drawings.

As shown in FIG. 9, the anode radiator plate 51 in the rectifying apparatus 5 is provided with six through holes 53 for fitting the rectifier elements 54. However, when it is not necessary, depending upon vehicle types, to fit the rectifiers 54 into all of the six through holes 53, for example, when only three rectifier elements are needed, the rectifier elements are fitted every two through holes. Therefore, the rest three though holes 53 which are not fitted to the rectifier elements remain open. Further, the rectifying apparatus 5 is designed for a highly-powered vehicle use a.c. dynamo 1. Therefore, the cooling wind for cooling each part of the vehicle use a.c. dynamo 1 flows along the arrow C as shown in FIG. 10, through the open through holes 53, thereby causing the concentrated leakage of the cooling wind. Therefore, the cooling wind does not flow along a designed path, thereby causing an insufficient cooling of the parts of the vehicle use a.c. dynamo 1. Thus, the conventional rectifying apparatus 5 has a disadvantage that any designed cooling effect can not be obtained.

SUMMARY OF THE INVENTION

An object of the present invention is to provide a rectifying apparatus for an a.c. dynamo for a vehicle use, whereby the cooling wind is prevented from passing through the unused open through holes in order to obtain a cooling effect as is designed.

The present invention includes seven Features stated below.

In Feature 1, the rectifying apparatus of the present invention comprises: rectifier elements 54 for rectifying a.c. current; through holes 53; and a radiator plate 51 for radiating heat generated by the rectifier elements, characterized in that the rectifier elements are disposed at a part of the through holes, while the blocking members 8 are disposed at the rest of the through holes.

Here, the blocking members 8 are of a material different from that of the rectifier elements 54.

According to Feature 1, the open through holes 53 at which the rectifier elements 54 are not disposed are blocked, thereby preventing the cooling wind from passing through the through holes 53, prohibiting the concentrated leakage of the cooling wind and thus obtaining a cooling effect as designed.

In Feature 2, the blocking member 8 is made of metal.

According to Feature 2, the radiating capability of the radiator plate 51 for radiating heat generated by the rectifier elements 53 can be improved.

In Feature 3, the blocking member 8 is made of non-metallic material.

According to Feature 3, a production cost of the non-metallic blocking members 8 can be reduced, compared to that of metal blocking members 8. Further, the vehicle use a.c. dynamo 1 can be made light-weighted. Furthermore, a shortening of product life of vehicle use a.c. dynamo can be prevented, due to the fact that the non-metallic blocking members 8 do not suffer any metallic corrosion.

In Feature 4, the projections 82 are provided on an edge surface along the axial direction of the blocking members 8.

According to Feature 4, a surface area of the blocking members 8 are increased, thereby improving the cooling effect.

In Feature 5, the blocking members 8 are a foil or plate.

According to Feature 5, a production coat of the blocking members 8 can be reduced. Further, the blocking members 8 can be easily disposed by simple method such as sticking.

In Feature 6, the rectifier elements 54 and blocking members 8 are fitted into the through holes 53.

According to Feature 6, the rectifier elements 54 and blocking members 8 can be fitted simultaneously by similar fitting jigs, thereby improving a productivity.

In Feature 7, the rectifier elements 54 and blocking members 8 are nearly cylindrical, while the through holes 53 are nearly circular.

According to Feature 7, a uniform force along the radial direction is applied, during fitting, to the rectifier elements 54 and blocking members 8, thereby preventing their deformations.

PREFERRED EMBODIMENTS OF THE INVENTION

Five specific Embodiments in accordance with the present invention are disclosed in detail below.

Figure 1:
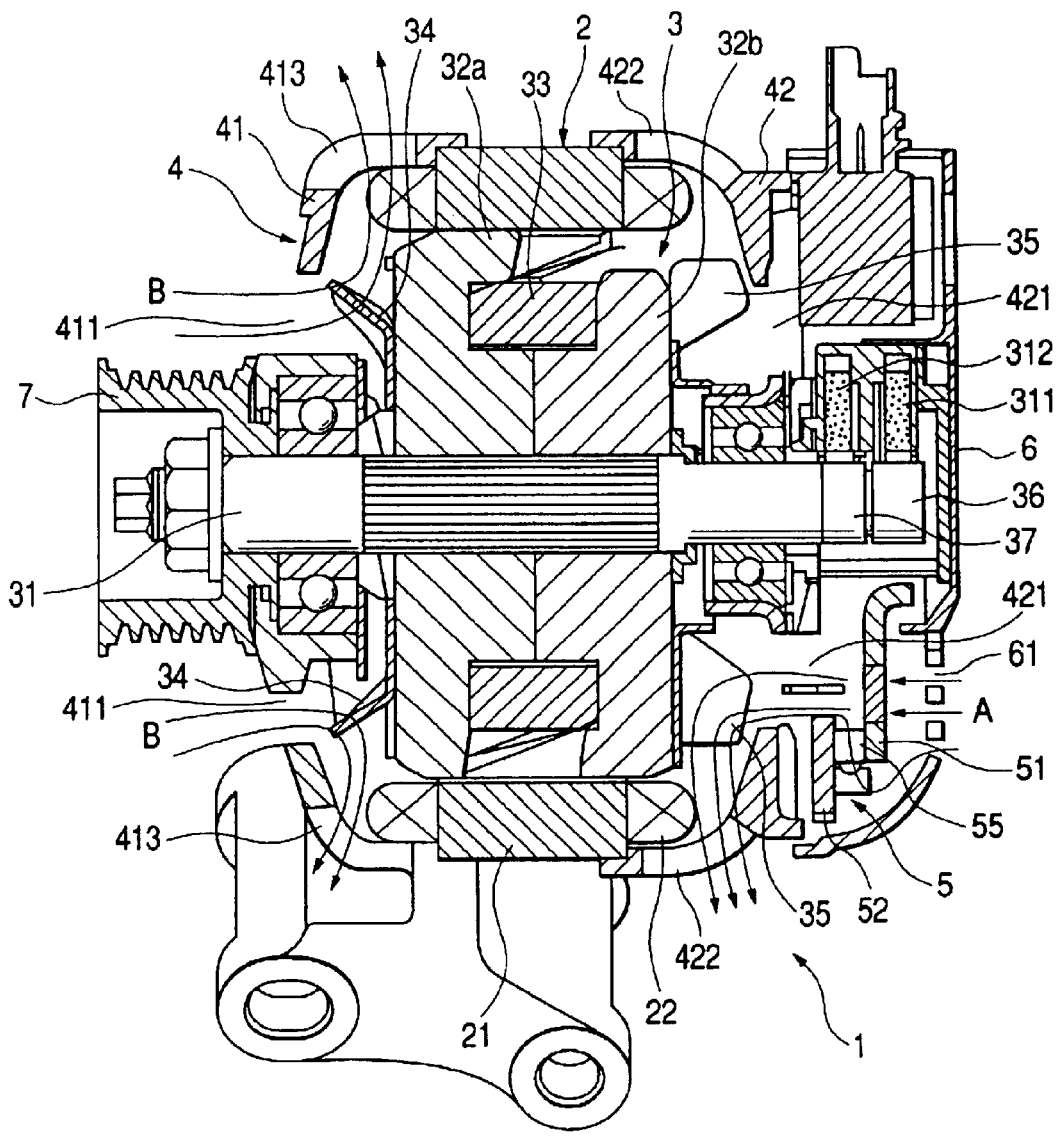
FIG. 1 is a cross sectional view of the whole structure of the alternating current dynamo for vehicle in Embodiment 1 of the present invention.
Figure 2:
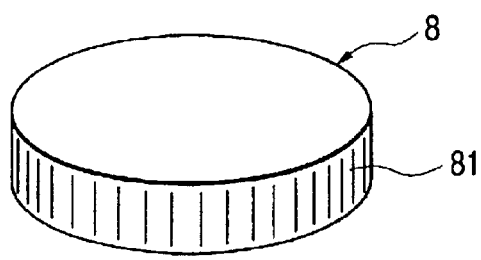
FIG. 2 is a perspective view of the blocking member of Embodiment 1 of the present invention.
Figure 3:
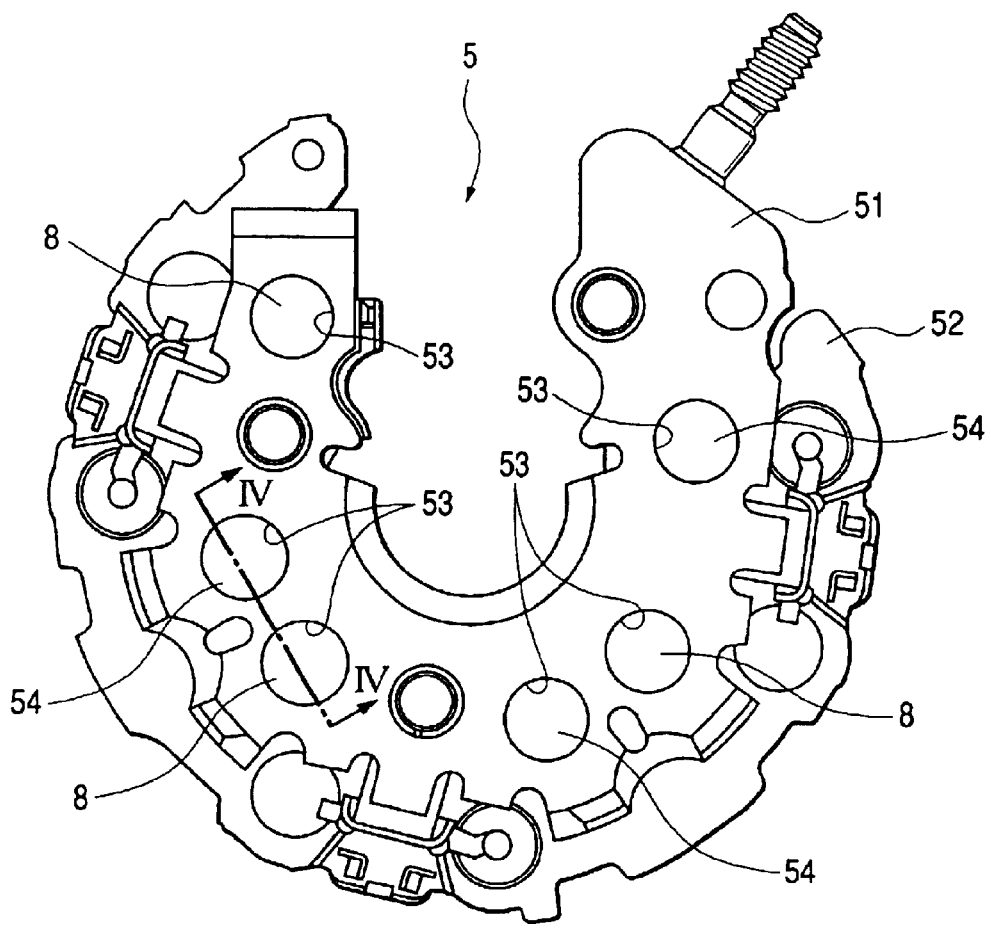
FIG. 3 is a plan view along the axial direction of the rectifying apparatus of Embodiment 1 of the present invention.
Figure 4:
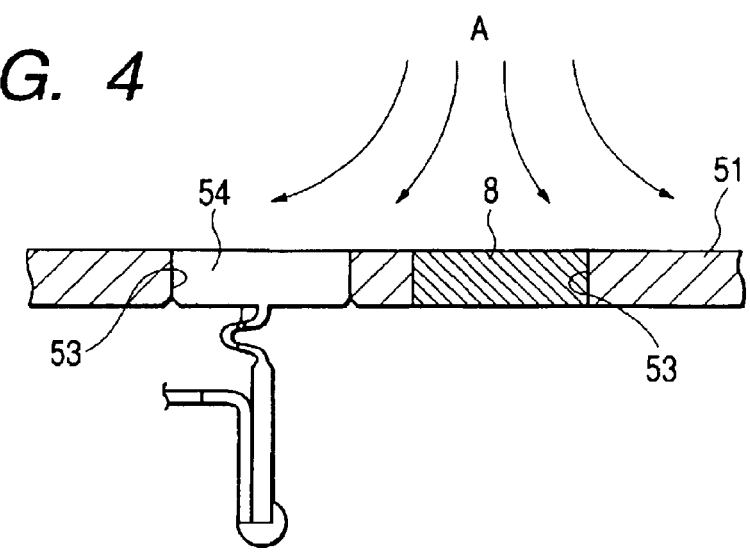
FIG. 4 is a cross sectional view on line IV—IV as shown in FIG. 8.

Embodiment 1 is shown in FIG. 1 which is a cross sectional view of the whole structure of the alternating current dynamo 1 for vehicle. FIG. 2 is a perspective view of the blocking member of Embodiment 1 of the present invention. Further, FIG. 3 is a plan view along the axial direction of the rectifying apparatus of Embodiment 1 of the present invention. FIG. 4 is a cross sectional view on line IV—IV as shown in FIG. 3.

The vehicle use a.c. dynamo 1 as shown in FIG. 1 comprises: stator 2; rotor 3; hausing 4; rectifying apparatus 5; cover 6; and pulley 7.

Further, the stator 2 comprises: stator core 21; and stator coil 22. They are supported by hausing 4. The stator core 21 made of piled thin steel plates is provided with a plurality of not-shown slots at its inner surface. The stator coil 22 is inserted into the slots. The rotating rotor 3 generates a alternating voltage in the stator coil 22.

The rotor 3 rotates together with the shaft 31. The rotor 31 comprises: rotor cores 32a, 32b; rotor coil 33; two slip rings 36, 37; front cooling fan 34; and rear cooling fan 35.

In the rotor coil 33 in rotor 3, an insulated conductive wire is wound cylindrically and concentrically. The rotor coil 33 is sandwitched by the rotor cores 32a and 32b through which the shaft 31 is inserted. Further, there is fixed, on the edge surface of the front rotor core 32a, by a method such as a spot welding, the front cooling fan 34 for blowing out along the axial and radial direction the cooling wind absorbed from the front side. Similarly, there is fixed, on the edge surface of the rear rotor core 32b, by a method such as a spot welding, the rear cooling fan 35 for blowing out along the radial direction the cooling wind absorbed from the rear side. Further, there are provided in the vicinity of the rear side edge of the shaft 31 two slip rings 36 and 37 which are connected with both ends of the rotor coil 33. The rotor coil 33 is electrically fed by brushes 311 and 312 through the slip rings 36 and 37.

The hausing 4 comprises: arm-shaped front hausing 41; and arm-shaped rear hausing 42. They support and fix elements including the stator 2 and rotor 3. The front hausing 41 and rear hausing 42 are fixed by not-shown bolts, respectively. In the stator 2, one axial end of the stator core 21 is pushed against the inner side of the front hausing 41, while its other axial end is pushed against the inner side of the rear hausing 42. Therefore, the stator core 21 is fixed, as if it were wrapped in the front hausing 41 and rear hausing 42. Further, the front hausing 41 has: air absorbing window 411 formed at one axial end surface for absorbing the cooling wind; and air blowing window 413 formed at the radial end surface for blowing out the cooling wind. Similarly, the rear hausing 42 has: air absorbing window 421 formed at one axial end surface for absorbing the cooling wind; and air blowing window 422 formed at the radial end surface for blowing out the cooling wind. The flow of the cooling wind will be describedlater.

The rectifying apparatus 5 is disposed outside the rear hausing 42. The rectifying apparatus 5 comprises: anode radiator plate 51; cathode radiator plate 52; rectifier elements 54 (cf. FIG. 3); and terminal stand 55. The through holes 53 (cf. FIG. 3) are provided in the anode radiator plate 51 in order to press in and fit the rectifier elements 54 into the through holes 53. Further, not-shown connecting terminals for connecting the rectifier elements 54 with the stator coil 22 are disposed on the terminal stand 55.

The plastic mold cover 6 for covering and protecting the electric parts of the rectifying apparatus 5 and so on is fixed outside the rear hausing 42. Further, a plurality of air absorbing slits 61 is formed in the cover 6.

The pulley 7 combined with the front side of the rotor 3 transfers a mechanical power from a not-shown engine to the rotor 3 through a belt. The rotation of the pulley 7 causes a rotation of the rotor 3 in a prescribed direction.

Next, the flow of the cooling wind is explained, here. The cooling wind absorbed by a rotation of the rear cooling fan 35 flows, in accordance with the arrow A as shown in FIG. 1, through the air absorbing slit 61, anode radiator plate 51, cathode radiator plate 52, air absorbing window 421, rotor 3, stator coil 22 and air blowing window 422, in this order, while the cooling wind absorbed by a rotation of the front cooling fan 34 flows, in accordance with the arrow B as shown in FIG. 1, through the air absorbing window 411, rotor 3, stator coil 22 and air blowing window 413, in this order.

Thus, the cooling wind absorbed from both the front and rear side is designed to flow through optimum paths in a prescribed order, whereby each temperature at each part of the vehicle use a.c. dynamo 1 is maintained at each prescribed value.

Next, the rectifying apparatus 5 which is a characteristic portion in the present invention is explained in detail, referring to FIGS. 2, 3 and 4.

In the present invention, the six through holes 53 are provided in the anode radiator plate 51, as shown in FIGS. 3 and 4. The rectifier elements 54 are pressed into the three through holes 53, while the blocking members 8 are pressed into the rest three through holes 53 into which the rectifier elements are not pressed. The blocking members 8 is made of metal, nearly cylindrical as shown in FIG. 2 and planar at the axial end surface. Further, an unevenness by knurling is formed at the outer circumference 81 of the blocking members 8. Further, the through hole 53 is nearly circular. Although the axial end surface of the blocking member 8 is planar in Embodiment 1, a smooth surface is not necessarily demanded. Therefore, the surface may be flat in such a manner that the surface quality does not work against production processes for the dynamo of the present invention.

As explained above, for the blocking members 8 are pressed into the through holes 53 without the rectifier elements, the cooling wind flows along the arrow A, without flowing through the through holes 53, as shown in FIG. 4.

Further, for the blocking member 8 is made of metal, the radiating capability of the radiator plate 51 for radiating heat generated by the rectifier elements 54 can be improved.

Further, the rectifier elements 54 and blocking members 8 are fitted into the through holes 53. Therefore, the rectifier elements 54 and blocking members 8 can be fitted simultaneously by similar fitting jigs, thereby improving a productivity.

Further, the rectifier elements 54 and blocking members 8 are nearly cylindrical, while the through holes 53 are nearly circular. Therefore, a uniform force along the radial direction is applied, during fitting, to the rectifier elements 54 and blocking members 8, thereby preventing their deformations.

Figure 5:
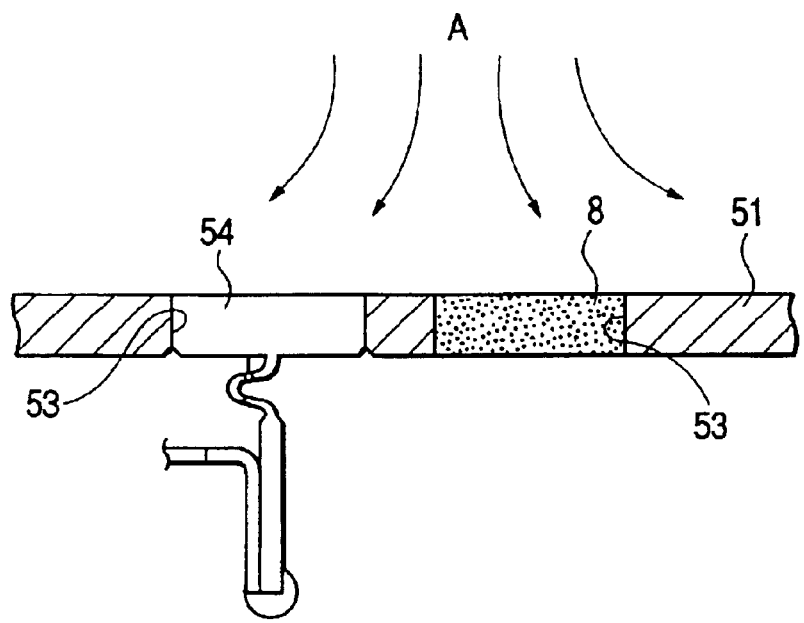
FIG. 5 is a partial cross sectional view of the anode radiator plate in the rectifying apparatus of Embodiment 2 of the present invention.

Embodiment 2 is shown in FIG. 5 which is a partial cross sectional view of the anode radiator plate 51. The non-metallic blocking member 8 blocks the through hole 53.

Even when the blocking member 8 is non-matallic, the cooling wind flows along the arrow A and it does not flow through the through hole 53. Therefore, the cooling wind flows through the designed paths, thereby cooling well each part of the dynamo 1.

Further, the blocking member 8 is made of non-metallic material. Therefore, a production cost of the non-metallic blocking members 8 can be reduced, compared to that of metal blocking members 8. Further, the vehicle use a.c. dynamo 1 can be made light-weighted. Furthermore, a shortening of product life of vehicle use a.c. dynamo can be prevented, due to the fact that the non-metallic blocking members 8 do not suffer any metallic corrosion.

Figure 6:
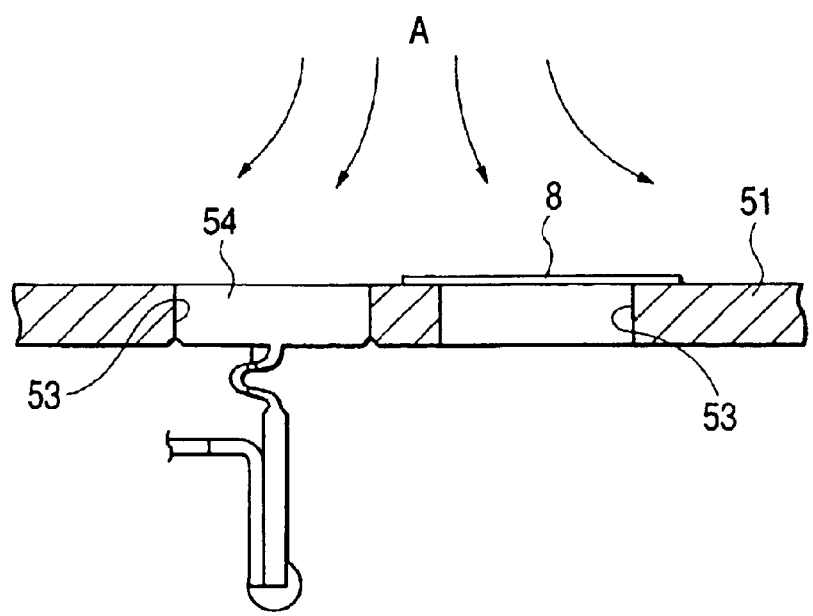
FIG. 6 is a partial cross sectional view of the anode radiator plate in the rectifying apparatus of Embodiment 3 of the present invention.

Embodiment 3 is shown in FIG. 6 which is a partial cross sectional view of the anode radiator plate 51. The blocking member 8 formed by a foil such as an aluminum tape blocks the through hole 53.

Even when the blocking member 8 is a foil, the cooling wind flows along the arrow A and it does not flow through the through hole 53. Therefore, the cooling wind flows through the designed paths, thereby cooling well each part of the dynamo 1.

Further, due to the foil, a production cost of the blocking members 8 can be reduced. Further, the blocking members 8 can be easily disposed by simple method such as sticking.

Although the blocking member is a foil in Embodiment 3, a plate blocking member 8 may be effective similarly.

Figure 7:
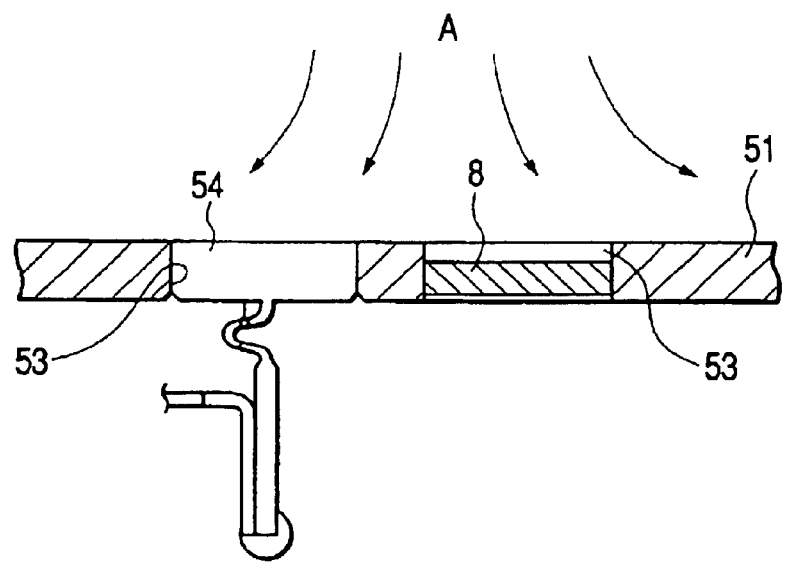
FIG. 7 is a partial cross sectional view of the anode radiator plate in the rectifying apparatus of Embodiment 4 of the present invention.

Embodiment 4 is shown in FIG. 7 which is a partial cross sectional view of the anode radiator plate 51. The blocking member 8 of which spacial volume is not equal to that of the through hole 53 blocks the through hole 53.

Even when the volume of the blocking member 8 is not equal to that of the through hole 53, the cooling wind flows along the arrow A and it does not flow through the through hole 53. Therefore, the cooling wind flows through the designed paths, thereby cooling well each part of the dynamo 1.

Although, as shown in FIG. 7, the volume of the blocking member 8 is smaller than that of the through hole 53, the volume of the blocking member 8 may be greater than that of the through hole 53, in such a manner that the flow of the cooling wind is not disturbed.

Figure 8:
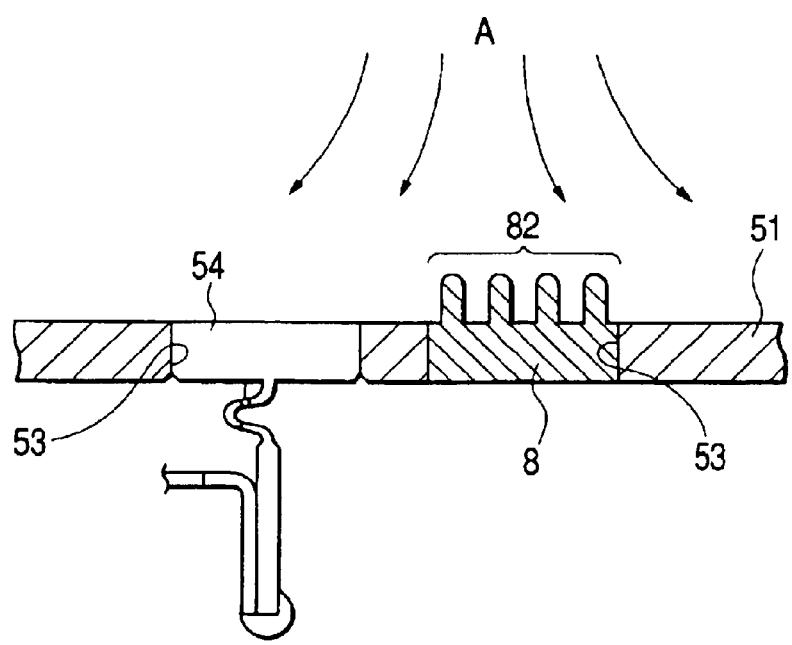
FIG. 8 is a partial cross sectional view of the anode radiator plate in the rectifying apparatus of Embodiment 5 of the present invention.
Figure 9:
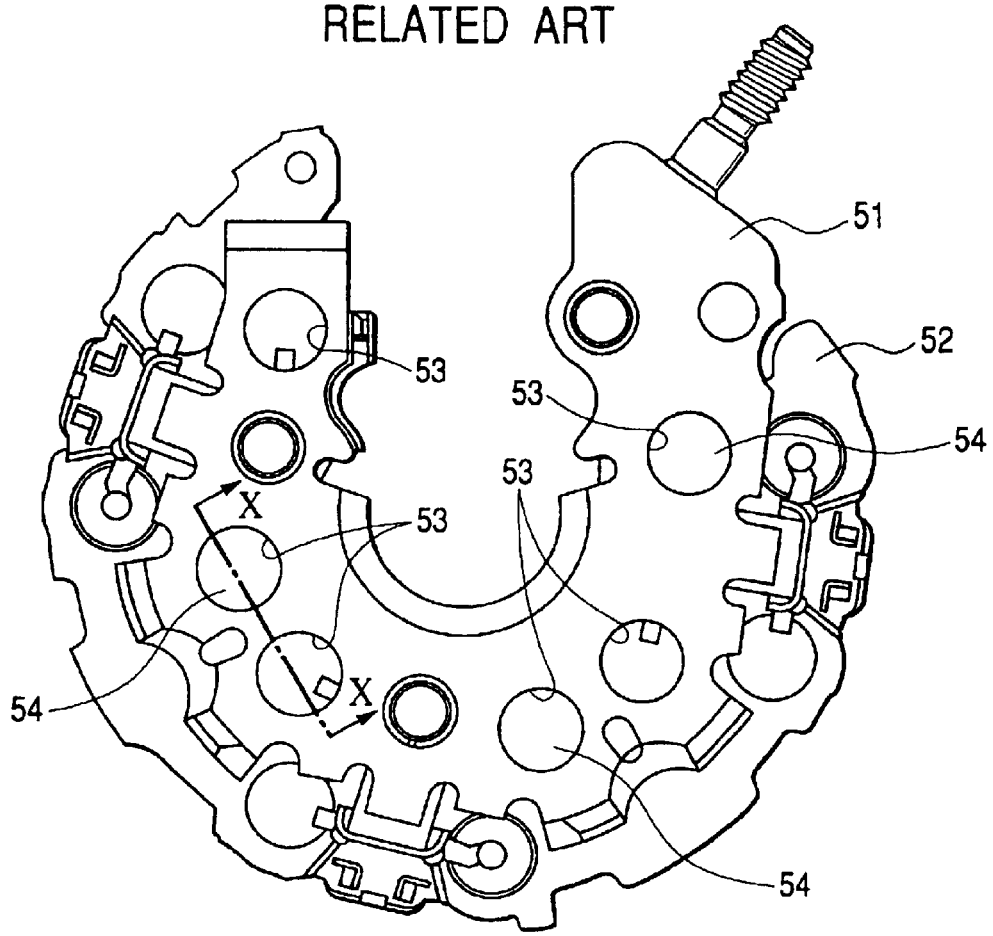
FIG. 9 is a plan view along the axial direction of the anode radiator plate in a conventional rectifying apparatus.
Figure 10:
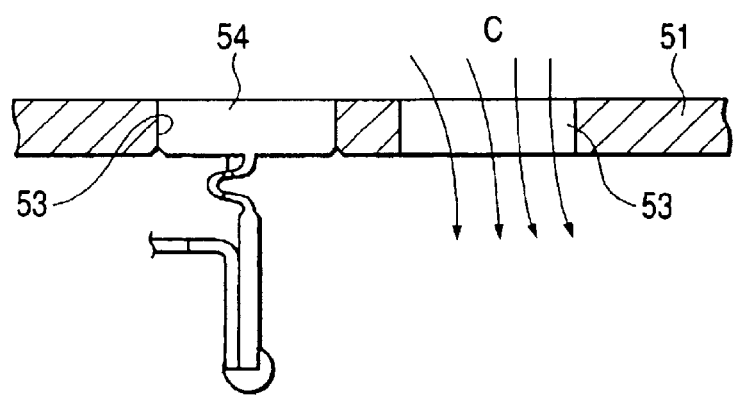
FIG. 10 is a cross sectional view on line X—X as shown in FIG. 9.

Embodiment 5 is shown in FIG. 8 which is a partial cross sectional view of the anode radiator plate 51. The blocking member 8 made of a material with a high thermal conductivity such as copper blocks the through hole 53. Here, there are provided projections 82 which project in the axial direction at a prescribed distance on one axial end surface.

Due to the projections 82, a surface area of the blocking members 8 are increased, thereby improving the cooling effect. The cooling wind flows along the arrow A and it does not flow through the through hole 53. Therefore, the cooling wind flows through the designed paths, thereby cooling well each part of the dynamo 1.

Although the blocking member 8 is pressed into or stuck on the through hole 53, other fixing methods may be employed as far as the blocking member 8 does not easily fall off from the through hole 53.

Further, although the above-explained Embodiments are applied to the anode radiator plate 51, they may be also applied to the cathode radiator plate 52.

What is claimed is:

1. A rectifying apparatus for an alternating current dynamo for a vehicle, comprising:

one or more rectifier elements which rectify an alternating current generated in the alternating current dynamo, a number of the rectifier elements being smaller than a predetermined number;

a radiator plate, having a plurality of through holes set at the predetermined number, which actually fits each of the rectifier elements into one of a part of the through holes and radiates heat generated by the rectifier elements, the through holes being configured to enable a plurality of expected rectifier elements to be fitted into the through holes, respectively; and one or more blocking members which block the other through holes not having the rectifier elements, the blocking members preventing a wind from flowing through the other through holes.

2. The rectifying apparatus according to claim 1, wherein said blocking members are made of metal.

3. The rectifying apparatus according to claim 1, wherein said blocking members are made of non-metallic material.

4. The rectifying apparatus according to claim 1, wherein a plurality of projections are provided on a surface of said blocking members.

5. The rectifying apparatus according to claim 1, wherein said blocking members are a foil or plate.

6. The rectifying apparatus according to claim 1, wherein said rectifier elements and said blocking members are pressed in and fitted into said through holes.

7. The rectifying apparatus according to claim 1, wherein said rectifier elements and said blocking members are nearly cylindrical, and said through holes are nearly circular.

8. The rectifying apparatus according to claim 1, wherein each of the blocking members has an outer circumference knurled in an uneven shape.

9. The rectifying apparatus according to claim 1, further comprising a second radiator plate placed opposite to the radiator plate through said rectifier element, wherein each of the blocking members is not connected with the second radiator plate.

* * * * *